US009490025B2

(12) United States Patent
Goda et al.

(10) Patent No.: US 9,490,025 B2
(45) Date of Patent: Nov. 8, 2016

(54) METHODS OF PROGRAMMING MEMORY DEVICES

(71) Applicant: Micron Technology, Inc., Boise, ID (US)

(72) Inventors: Akira Goda, Boise, ID (US); Andrew Bicksler, Boise, ID (US); Violante Moschiano, Bacoli (IT); Giuseppina Puzzilli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 108 days.

(21) Appl. No.: 14/143,763

(22) Filed: Dec. 30, 2013

(65) Prior Publication Data

US 2014/0112068 A1 Apr. 24, 2014
US 2015/0029788 A9 Jan. 29, 2015

Related U.S. Application Data

(63) Continuation of application No. 12/556,941, filed on Sep. 10, 2009, now Pat. No. 8,619,474.

(51) Int. Cl.
| | |
|---|---|
| *G11C 16/12* | (2006.01) |
| *G11C 16/34* | (2006.01) |
| *G11C 11/56* | (2006.01) |
| *G11C 16/04* | (2006.01) |
| *G11C 16/10* | (2006.01) |

(52) U.S. Cl.
CPC ....... *G11C 16/3427* (2013.01); *G11C 11/5628* (2013.01); *G11C 16/0483* (2013.01); *G11C 16/10* (2013.01); *G11C 16/12* (2013.01); *G11C 16/3418* (2013.01); *G11C 2211/5621* (2013.01)

(58) Field of Classification Search
CPC .......... G11C 11/5628; G11C 16/0483; G11C 16/10; G11C 16/3427; G11C 16/12; G11C 16/3418; G11C 2211/5621
See application file for complete search history.

(56) References Cited

U.S. PATENT DOCUMENTS

| | | | |
|---|---|---|---|
| 6,567,314 B1 | 5/2003 | Ogura et al. | |
| 2003/0112663 A1* | 6/2003 | Quader | G11C 11/5628 365/185.22 |
| 2010/0097863 A1 | 4/2010 | Kim et al. | |
| 2010/0302858 A1 | 12/2010 | Bicksler | |
| 2011/0013457 A1* | 1/2011 | Han | G11C 11/5628 365/185.18 |
| 2011/0085385 A1* | 4/2011 | Park | G11C 11/5621 365/185.22 |
| 2011/0194352 A1 | 8/2011 | Zhao et al. | |

FOREIGN PATENT DOCUMENTS

KR   10-2009-0048763   5/2009

* cited by examiner

*Primary Examiner* — Douglas King
(74) *Attorney, Agent, or Firm* — Dicke, Billig & Czaja, PLLC (57) ABSTRACT

Methods of programming memory devices include biasing each data line of a plurality of data lines to a program inhibit voltage; discharging a first portion of data lines of the plurality of data lines, wherein the first portion of data lines of the plurality of data lines are coupled to memory cells selected for programming; and applying a plurality of programming pulses to the memory cells selected for programming while biasing a remaining portion of data lines of the plurality of data lines to the program inhibit voltage.

19 Claims, 10 Drawing Sheets

METHODS OF PROGRAMMING MEMORY DEVICES

RELATED APPLICATION

This application is a continuation of U.S. patent application Ser. No. 12/556,941, titled "DATA LINE MANAGEMENT IN A MEMORY DEVICE," filed Sep. 10, 2009 and issued as U.S. Pat. No. 8,619,474 on Dec. 31, 2013, (allowed) which is commonly assigned and incorporated herein by reference.

TECHNICAL FIELD

The present disclosure relates generally to semiconductor memory and more particularly, in one or more embodiments, to non-volatile memory devices.

BACKGROUND

Flash memory devices have developed into a popular source of non-volatile memory for a wide range of electronic applications. Flash memory devices typically use a one-transistor memory cell (e.g., floating gate memory cell) that allows for high memory densities, high reliability, and low power consumption. Changes in threshold voltage of the cells, through programming of a charge storage node, such as a floating gate or charge trap, or other physical phenomena, determine the data value of each cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

Figure 1:
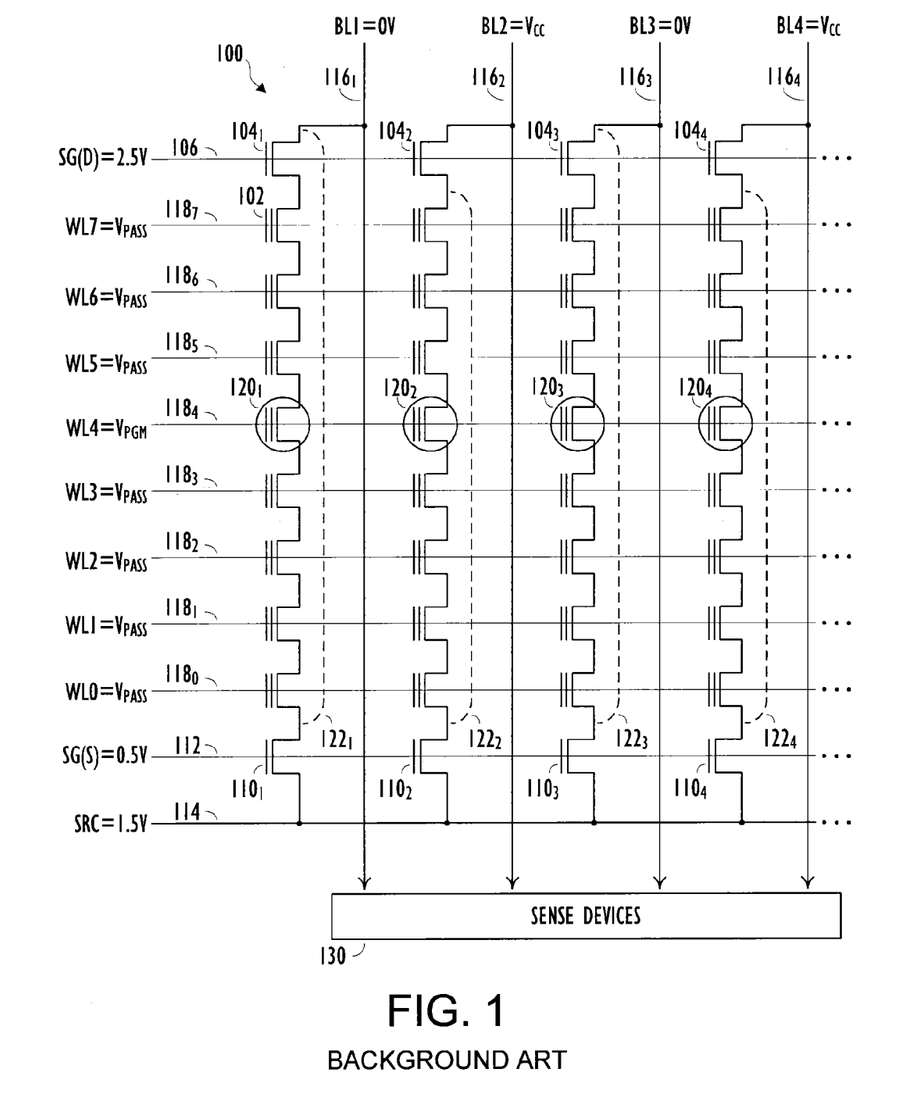
FIG. 1 shows a typical arrangement of multiple series strings of memory cells of a memory array organized in a NAND architecture.

Flash memory typically utilizes one of two basic architectures known as NOR Flash and NAND Flash. The designation is derived from the logic used to read the devices. FIG. 1 illustrates a NAND type flash memory array architecture 100 wherein the floating gate memory cells 102 of the memory array are logically arranged in a matrix of rows and columns. The memory cells 102 of the array are also arranged together in strings (e.g., NAND strings), typically of 8, 16, 32, or more each, where the memory cells in a string are connected together in series, source to drain, between a common source line 114 and a data line 116, often referred to as a bit line. The array is then accessed by a row decoder activating a row of floating gate memory cells (e.g., 120) by selecting a particular access line (e.g., $118_4$), often referred to as a word line, connected to their gates. In addition, bit lines BL1-BL4 116 can also be driven high or low depending on the current operation being performed. As is known to those skilled in the art, the number of word lines and bit lines might be much greater than those shown in FIG. 1.

Bit lines BL1-BL4 116 are coupled to sensing devices (e.g., sense amplifiers) 130 that detect the state of each cell by sensing voltage or current on a particular bit line 116. The word lines WL7-WL0 118 select the individual memory cells 102 in the series strings to be written to or read from and operate the remaining memory cells in each series string in a pass through mode. Each series string of memory cells is coupled to a source line 114 by a source select gate 110 and to an individual bit line BL1 $116_1$ by a drain select gate $104_1$, for example. The source select gates 110 are controlled by a source select gate control line SG(S) 112 coupled to the source select gate control gates. The drain select gates, such as 104, are controlled by a drain select gate control line SG(D) 106.

During a typical programming operation performed on a memory array as illustrated in FIG. 1, a particular word line is selected for programming, such as WL4 $118_4$, for example. During a programming operation alternate bit lines are enabled and inhibited from programming. For example, even numbered bit lines might be enabled for programming memory cells coupled to even numbered bit lines while the odd numbered bit lines are inhibited from programming memory cells coupled to the odd numbered bit lines. A subsequent programming operation then inhibits the even numbered bit lines and enables the odd numbered bit lines. Bit lines are typically enabled for programming of their associated memory cells by applying 0V to those bit lines. Bit lines are typically inhibited from programming their associated memory cells by applying a supply voltage, Vcc (e.g., 2.3V), to those bit lines, for example. Another programming method employs biasing one or more of the bit lines during a programming operation to a level that does not inhibit programming but effectively reduces the rate of programming. For example, a bit line might be biased to a voltage of 0.5V to slow programming of a memory cell coupled to the bit line during a programming operation.

FIG. 1 further illustrates an example of bias potentials that might be applied during a programming operation performed on a selected row (e.g., WL4 $118_4$) of memory cells. During the example programming operation, the channel region $122_{1,3}$ is biased to 0V as a result of the 2.5V present on the SG(D) line 106 which enables select gates $104_{1,3}$. The channel region $122_{2,4}$ is not biased to the potential on BL2, BL4 $116_{2,4}$ due to the Vcc potential present on those bit lines which places the select gates $104_{2,4}$ in an off condition. The source select gates 110 of each string are biased by the SG(S) voltage (e.g., 0.5V) in a manner as to render them in an off condition. In the example of FIG. 1, a VPASS voltage is applied to each unselected word line $118_7$-$118_5$,$118_3$-$118_0$. VPASS might be 10V, for example. The VPASS voltage is sufficient to turn the unselected memory cells on but is not high enough to cause programming of those memory cells. A programming potential VPGM is applied to the word line selected for programming, such as WL4 $118_4$, for example. VPGM typically comprises a series of increasing voltage pulses throughout the programming operation. VPGM programming pulses might range from 12V to 25V, for example. As a result of the VPASS voltage placed on each unselected word line and the VPGM voltage placed on the selected word line, the channel region $122_2$, indicated by dashed lines, of the BL2 $116_2$ string is boosted up. For example, the channel region $122_2$ might be boosted up to a potential of 8V as a result of the drain select gate $104_2$ being in an off state. The channel region $122_1$ is held at the 0V potential of BL1 $116_1$ because drain select gate $104_1$ is in an on state. However, the drain select gates $104_{2,4}$ might still leak charge from channel regions $122_{2,4}$ (boosted to 8V) to BL2, BL4 $116_{2,4}$ which are biased at Vcc (e.g., 2.3V). This leakage of charge through drain select gates $104_{2,4}$ can cause undesirable effects on memory cells that are not selected for programming. These undesirable effects are referred to as program disturb effects which can alter the programmed state of memory cells to an unintended state.

For the reasons stated above, and for other reasons which will become apparent to those skilled in the art upon reading and understanding the present specification, there is a need in the art, for example, for alternate biasing schemes that serve to mitigate the effects of program disturb.

DETAILED DESCRIPTION

In the following detailed description of the present embodiments, reference is made to the accompanying drawings that form a part hereof, and in which is shown by way of illustration specific embodiments in which the embodiments may be practiced. These embodiments are described in sufficient detail to enable those skilled in the art to practice the invention, and it is to be understood that other embodiments may be utilized and that process, electrical or mechanical changes may be made without departing from the scope of the present disclosure. The following detailed description is, therefore, not to be taken in a limiting sense.

As the performance and complexity of electronic systems increases, the requirement for additional memory in these systems also increases. This requirement can be addressed by increasing the memory density of an integrated circuit by using such technologies as multilevel cells (MLC). For example, MLC NAND flash memory is a cost effective non-volatile memory.

Multilevel memory cells assign a data state (e.g., as represented by a bit pattern) to a specific range of threshold voltages (Vt) stored on the memory cell. Single level memory cells (SLC) permit the storage of a single binary digit (e.g., bit) of data on each memory cell. Meanwhile, MLC technology permits the storage of two or more binary digits per cell (e.g., 2, 4, 8, 16 bits), depending on the quantity of threshold voltage ranges assigned to the cell and the stability of the assigned threshold voltage ranges during the lifetime operation of the memory cell. The number of threshold voltage ranges, which are sometimes referred to as Vt distribution windows, used to represent a bit pattern comprised of N-bits is $2^N$. For example, one bit may be represented by two ranges, two bits by four ranges, three bits by eight ranges, etc. Some memory cells can store fractional numbers of bits, such as 1.5 bits per cell. A common naming convention is to refer to SLC memory as MLC (two level) memory as SLC memory utilizes two data states in order to store one bit of data as represented by a 0 or a 1, for example. MLC memory configured to store two bits of data can be represented by MLC (four level), three bits of data by MLC (eight level), etc.

Figure 2:
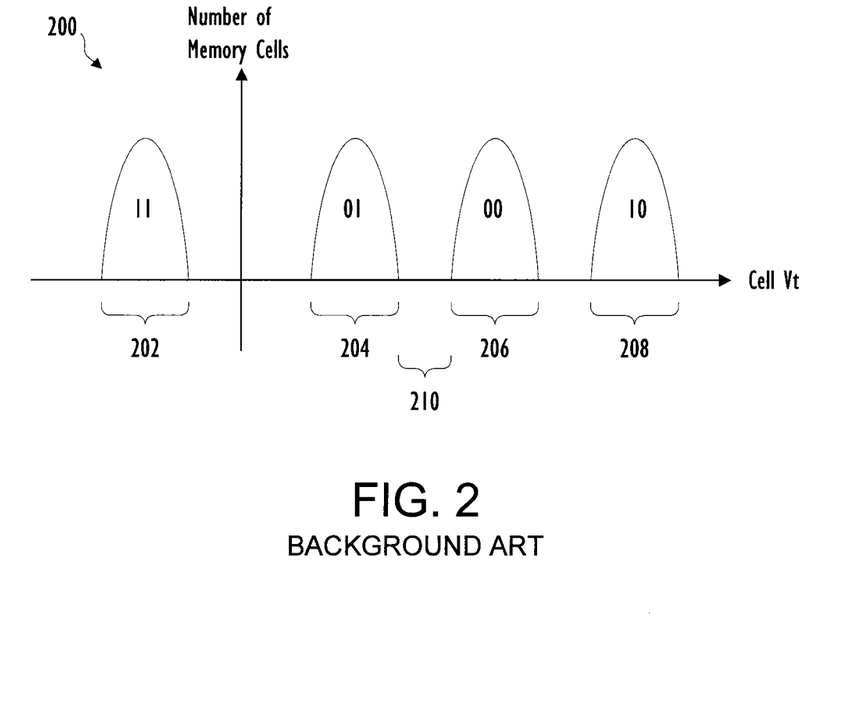
FIG. 2 shows a threshold voltage distribution.

FIG. 2 illustrates an example of a Vt distribution 200 for a MLC (four-level) memory cells. For example, cells of a memory device may be programmed to a Vt that falls within one of four different voltage ranges 202-208 of 200 mV, each being used to represent a data state corresponding to a bit pattern comprised of two bits. Typically, a dead space 210 (which is sometimes referred to as a margin) of 0.2V to 0.4V is maintained between each range to keep the ranges from overlapping. As one example, if the voltage stored on a cell is within the Vt range 202, the cell in this case is storing a logical '11' state and is typically considered the erased state. If the voltage is within the Vt range 204, the cell in this case is storing a logical '01' state. A voltage in the range 206 of the four Vt ranges would indicate that the cell in this case is storing a logical '00' state. Finally, a Vt residing in the Vt range 208 indicates that a logical '10' state is stored in the cell. The '01', '00' and '10' states can be referred to as the programmed states.

Figure 3A:
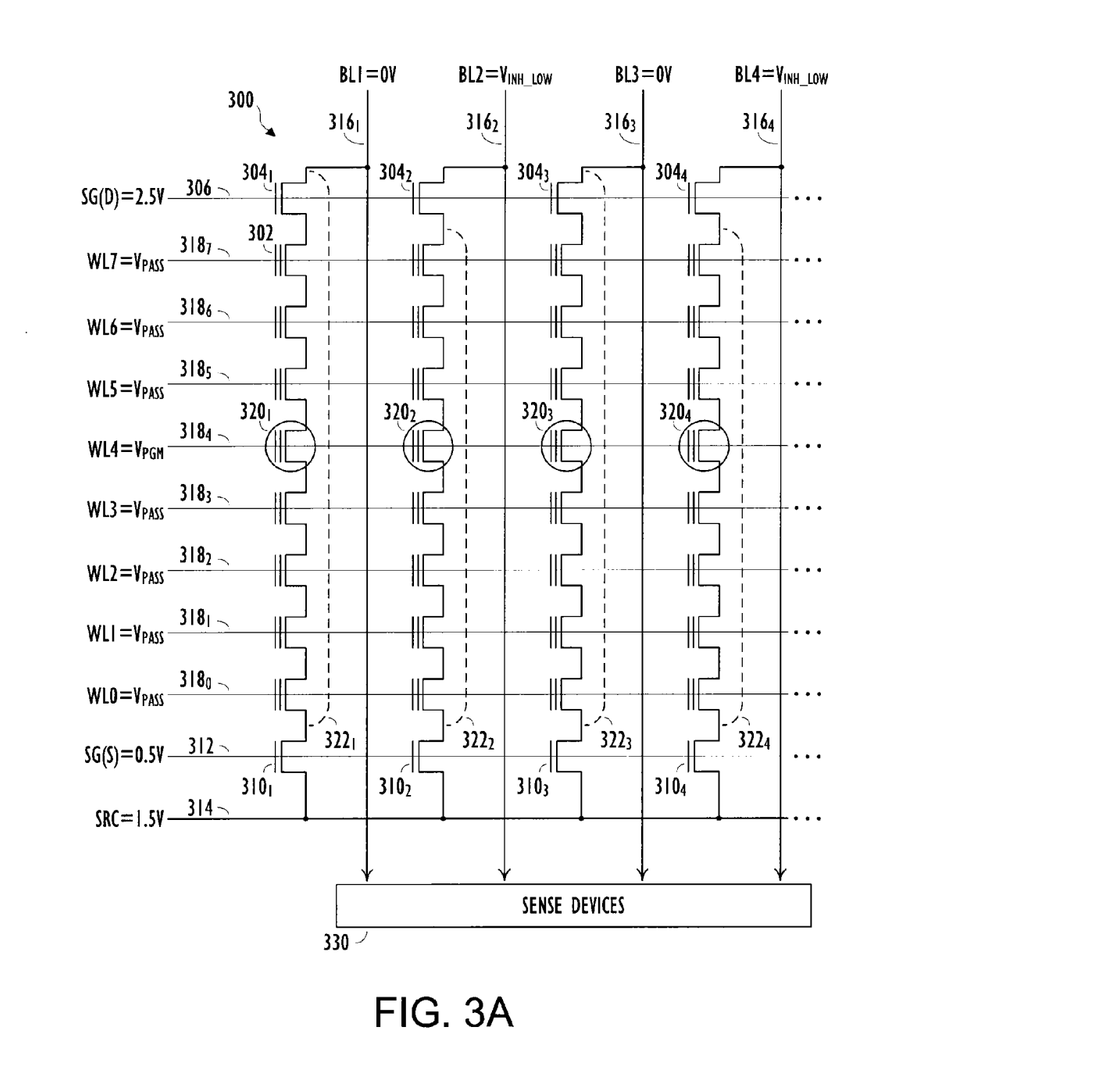
FIGS. 3A and 3B show a biasing scheme for programming according to an embodiment of the present disclosure.
Figure 3B:
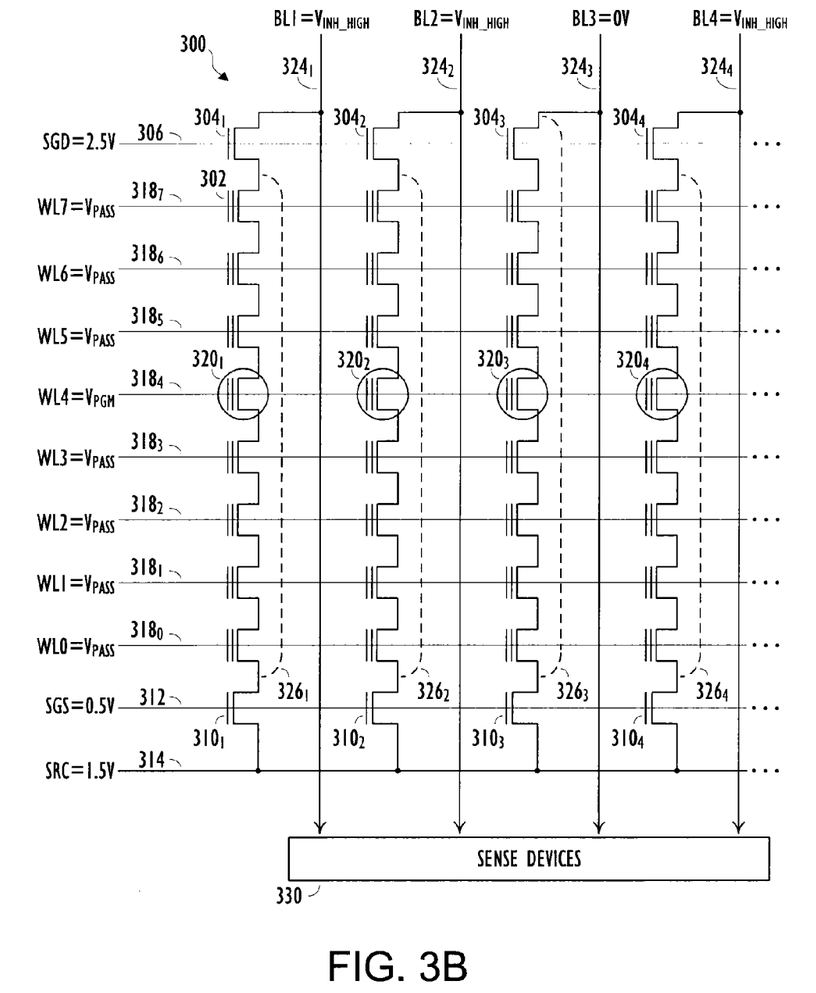

FIGS. 3A and 3B illustrate a biasing scheme for programming a number of memory cells according to one or more embodiments of the present disclosure. The array 300 of memory cells 302 of FIG. 3 might comprise SLC and/or MLC memory cells and may comprise many more word lines 318 and bit lines 316, 324 than those shown, for example. FIG. 3A illustrates a biasing scheme during a first portion of a programming operation and FIG. 3B illustrates a biasing scheme during a second portion of the programming operation according to various embodiments of the present disclosure, for example. In the particular example illustrated by FIG. 3, the memory cells $320_{1,3}$ coupled to word line WL4 $318_4$ are selected for programming. Memory cells $320_{2,4}$ are to be inhibited from programming. During a later programming operation, the memory cells $320_{1,3}$ might be inhibited from programming and memory cells $320_{2,4}$ might be selected for programming, for example. The memory cells $320_{1,3}$ might be considered a first page of memory cells whereas the memory cells $320_{2,4}$ might be considered a second page of memory cells.

As discussed above, a programming operation typically comprises applying a series of programming pulses to the selected word line. Unselected word lines $318_{7-5,3-0}$ have a $V_{PASS}$ potential (e.g., 10V) applied to them during the programming operation. The series of programming pulses (e.g., $V_{PGM}$) start at a first level and increase by some amount (e.g., 0.5V increments) as each pulse is applied to the selected word line $318_4$. $V_{PGM}$ might range from 12V to 25V, for example. Signal SG(S) 312 biases the control gates of each source select transistor 310 with a voltage (e.g., 0.5V) to disable each source gate transistor 310. Signal SG(D) 306 biases the control gates of each drain select transistor 304 with 2.5V, for example. However, only drain select gates $304_{1,3}$ become conductive (e.g., turn on) as the bit lines coupled to each of these gates $316_{1,3}$ are biased at 0V. Drain select transistors $316_{2,4}$ are not turned on because the bit lines these gates $316_{2,4}$ are coupled to are biased to $V_{INH\_LOW}$ (e.g., Vcc) which prevents these gates from turning on.

As a result of the biasing conditions illustrated in FIG. 3A, the channel regions $322_{1,3}$ of the memory cell strings coupled to the program enabled bit lines $316_{1,3}$ are rendered conductive and are pulled to their respective bit line potential (e.g., 0V) as a result of the on state of drain select gates $304_{1,3}$. The off state of the drain select gates $304_{2,4}$ coupled to the program inhibited bit lines $316_{2,4}$ allow the channel regions $322_{2,4}$ to be capacitively coupled up to a potential (e.g., 8V) which inhibits the unselected memory cells $320_{2,4}$ from programming. However, as discussed above, it is possible that the disabled drain select gates $304_{2,4}$ might leak due to the potential difference across each drain select transistor of the channel potential $322_{2,4}$ of about 8V and the bit line potential $V_{INH\_LOW}$. This charge leakage can reduce the potential of the isolated channel regions $322_{2,4}$ and result in some amount of program disturb of unselected memory cells $320_{2,4}$. The isolated channel regions $322_{2,4}$ might be reduced from a potential of 8V to 6V as a result of charge leakage through the disabled drain select gates $304_{2,4}$, for example.

Between the application of one or more programming (e.g., $V_{PGM}$) pulses, a verify operation is performed to check each selected memory cell to determine if it has reached its intended programmed state, such as those states illustrated in FIG. 2, for example. If a selected memory cell has reached its intended programmed state it is inhibited from further programming if there remain other memory cells of the selected row still requiring additional programming pulses to reach their intended programmed states. Following a verify operation, an additional programming pulse $V_{PGM}$ is applied if there are memory cells that have not completed programming. This process of applying a programming pulse followed by performing a verify operation continues until all the selected memory cells have reached their intended programmed states. If a particular number of programming pulses (e.g., maximum number) have been applied and one or more selected memory cells still have not completed programming, those memory cells might be marked as defective, for example.

When a memory cell of a selected row has reached its intended programmed state, it is inhibited from further programming by biasing its associated bit line to a program inhibit level, such as to $V_{INH\_LOW}$ as shown being applied to BL2 and BL4 $316_{2,4}$ of FIG. 3A. $V_{INH\_LOW}$ might be Vcc, for example. Although not shown in FIG. 3A, once selected memory cell $320_1$ reaches its intended programmed state, its associated bit line BL1 $316_1$ will change from being biased to 0V, as shown in FIG. 3A, to instead be biased to $V_{INH\_LOW}$, for example. As more and more selected memory cells reach their intended programming levels, the more bit lines 316 of the array 300 that will be biased with $V_{INH\_LOW}$ so as to inhibit those memory cells from further programming.

A further result of the biasing scheme illustrated in FIG. 3A is that charging the program inhibited bit lines $316_{2,4}$ to the program inhibit level (e.g., $V_{INH\_LOW}$) is difficult due to the high bit line capacitance between the program inhibited bit lines $316_{2,4}$ and the adjacent selected bit lines $316_{1,3}$ being driven to a potential of 0V. Data patterns to be programmed in a selected page of memory cells might vary from every memory cell being selected for programming to only one memory cell being selected for programming. Thus, a worst case bit line capacitance condition will likely occur when every memory cell of the selected page is to be programmed as this condition will yield the largest number of bit lines being biased to 0V resulting in the greatest amount of bit line capacitance between the program enabled bit lines (e.g., even page bit lines) and the program inhibited bit lines (e.g., odd page bit lines.) As selected memory cells begin to reach their intended programmed states, their associated bit line biasing will change from enabled (e.g., 0V) to inhibited (e.g., $V_{INH\_LOW}$.) As more and more bit lines change from enabled to inhibited the overall bit line to bit line capacitance of the array 300 will begin to decrease.

The biasing scheme changes from that illustrated in FIG. 3A to that illustrated in FIG. 3B responsive to a particular threshold event during the programming operation according to one or more embodiments of the present disclosure. Particular threshold events according to various embodiments of the present disclosure are discussed later with respect to FIGS. 4-7.

FIG. 3B illustrates the biasing scheme utilized responsive to a particular threshold event (e.g., following the application of a particular number of programming pulses) which triggers a change from the biasing scheme illustrated in FIG. 3A to that of FIG. 3B. Prior to changing the biasing scheme of FIG. 3B, one or more programming pulses have been applied to the word line WL4 $318_4$ coupled to the page of memory cells $320_{1,3}$ selected for programming.

FIG. 3B illustrates that memory cells $320_2$ and $320_4$ remain inhibited from programming as they were as shown in FIG. 3A. In the example of FIG. 3B, previously program enabled and selected memory cell $320_1$ is now inhibited from further programming as it has reached its intended programmed state, for example. Although not shown, bit line $324_1$ (e.g., bit line $316_1$ of FIG. 3A) might have been biased to $V_{INH\_LOW}$ along with bit lines $316_{2,4}$, as discussed above, prior to being biased to the condition shown in FIG. 3B. Selected memory cell $320_3$ has not yet achieved its intended programmed state and its bit line $324_3$ is still program enabled by the 0V bias on that bit line.

As discussed above, at a particular point in the programming operation, program inhibited bit lines that were originally inhibited and/or bit lines that were changed to an inhibited state as their respective selected memory cells reached their intended programmed states, are biased to a higher bit line potential than $V_{INH\_LOW}$. This is indicated in FIG. 3B by the bit line biasing of bit lines $324_{1,2,4}$ to $V_{INH\_HIGH}$. $V_{INH\_HIGH}$ might be approximately two times Vcc according to one or more embodiments of the present disclosure. For example, $V_{INH\_HIGH}$ might be substantially equal to 4V. As discussed above, as more and more bit lines are program inhibited, the overall bit line to bit line capacitance decreases. At a certain point this capacitance is reduced enough that the program inhibited bit lines can now be driven to the higher bit line voltage (e.g., $V_{INH\_HIGH}$). Program disturb effects are greater as the programming pulse potential ($V_{PGM}$) increase. The application of the higher inhibit voltage $V_{INH\_HIGH}$ serves to reduce the potential difference across the drain select gates $304_{1,2,3}$ and the isolated channel regions $326_{1,2,4}$. This reduction in potential difference reduces the likelihood of charge leaking through a disabled drain select gate to its coupled bit line which in turn helps to mitigate the effect of program disturb in the inhibited memory cells. According to one or more embodiments, all the program inhibited bit lines might be biased up to the $V_{INH\_HIGH}$ level at the same time. Still further embodiments might bias up only a subset of the program inhibited bit lines. For example, if a particular number of program inhibited bit lines biased to the lower inhibit level (e.g., $V_{INH\_LOW}$) are adjacent one another, those bit lines might be biased to the higher level (e.g., $V_{INH\_HIGH}$) while program inhibited bit lines which are adjacent a program enabled bit line might remain biased at the lower $V_{INH\_LOW}$ inhibit voltage. Additional programming pulses and verify operations will be performed until all the selected memory cells have reached their intended programmed states, or until a maximum number of operations have been performed.

Figure 4:
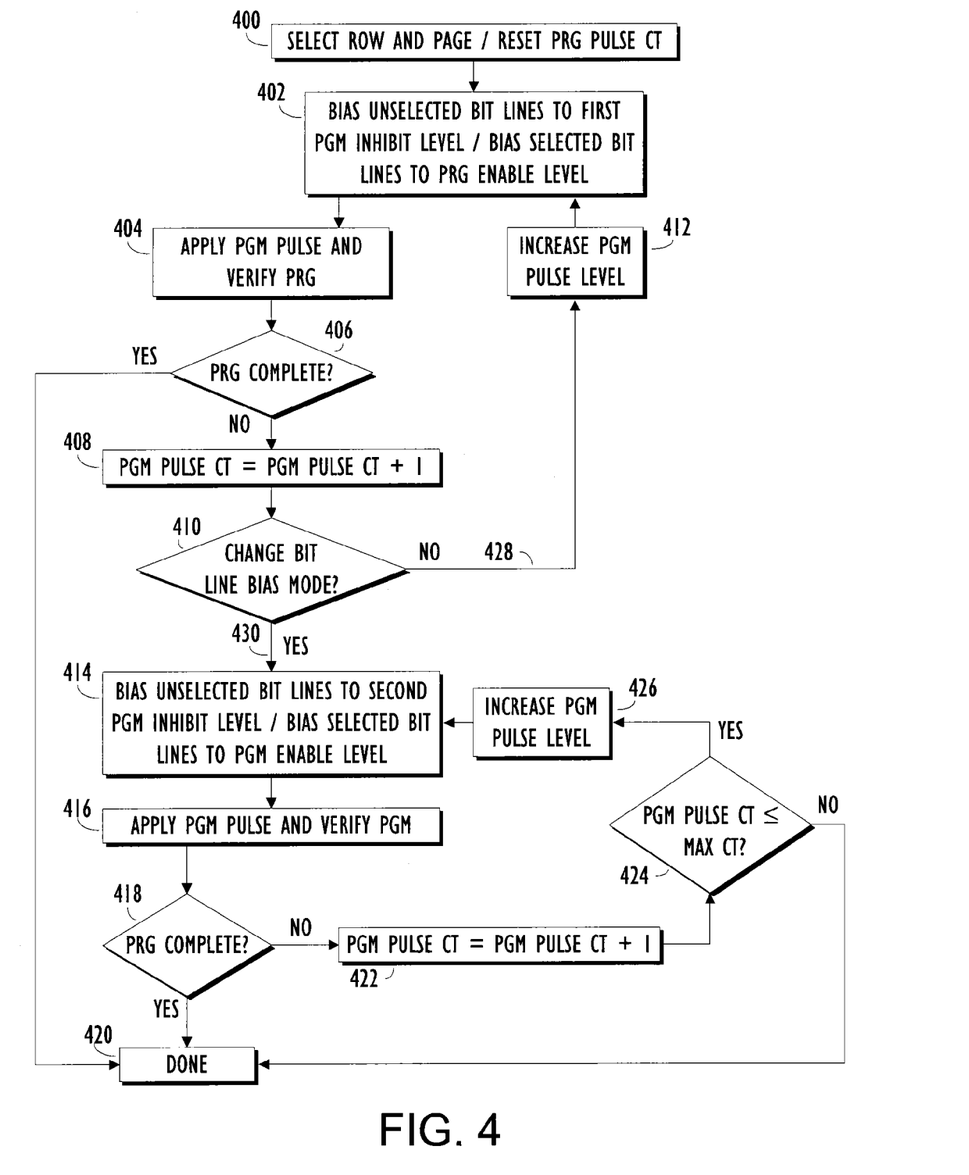
FIG. 4 shows a flowchart illustrating a programming process according to an embodiment of the present disclosure.

FIG. 4 illustrates a flowchart of a programming operation according to one or more embodiments of the present disclosure. A row and page of memory cells are selected for programming 400 and a program pulse count PRG PULSE CT value is reset, such as to zero, for example. Unselected bit lines are biased to a first program inhibit voltage 402, such as $V_{INH\_LOW}$ discussed above, for example. Selected bit lines are biased to a program enable voltage, such as 0V, for example. A program pulse is applied to the selected row 404 which is followed by a verify operation to determine if the selected memory cells have completed programming. If all the selected memory cells have completed programming 406 then the programming operation is complete 420. If all the selected memory cells have not completed programming, then PGM PULSE CT value is updated (e.g., incremented by 1.) A determination is made 410 if the biasing scheme (e.g., programming mode) should continue such as shown in FIG. 3A or if the biasing scheme should change to the scheme illustrated by FIG. 3B. Should it be determined that the biasing scheme is not to change 428, then the programming pulse level is increased 412 (e.g., by 1V.) The unselected bit lines are again biased to the first (e.g., lower) inhibit voltage and the selected bit lines are again biased to the program enable voltage 402. A programming pulse at the level determined by step 412 is applied to the selected word line and the selected memory cells are again verified to determine if all the selected memory cells have completed programming 406. These steps are repeated until all selected memory cells complete programming or the determination 410 is made to change 430 to the biasing scheme of FIG. 3B. Various threshold events which might lead to a decision 410 to change bit line biasing schemes according to various embodiments of the present disclosure are discussed with respect to FIGS. 5-7.

Figure 5:
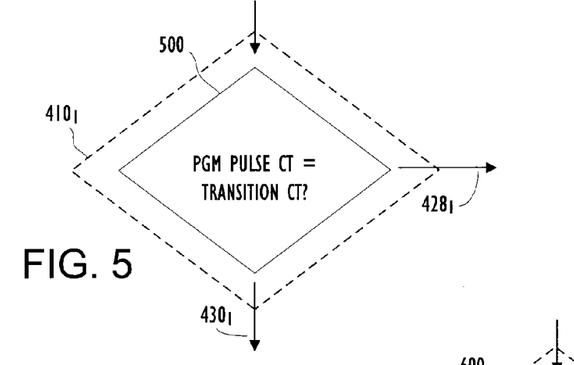
FIG. 5 shows additional detail of a programming process step such as shown in FIG. 4 according an embodiment of the present disclosure.

A change to the biasing scheme of FIG. 3B may be made responsive to the threshold event 500 illustrated in FIG. 5. A comparison of the current PGM PULSE CT may be made with a particular pulse count to determine if the biasing scheme should change. For example, if the PGM PULSE CT has reached a count of 15 (e.g., 15 programming pulses have been applied in step 404) then the biasing scheme may be changed $430_1$. If less than 15 programming pulses have been applied to the selected word line then the same biasing scheme may be used $428_1$ and the program pulse level is incremented as discussed with regard to step 412. Other numbers of applied programming pulses might be used as the criteria to change biasing schemes according to one or more embodiments of the present disclosure. For example, according to one or more embodiments there may be a particular maximum number of programming pulses that might be applied. Following the application of a particular number (e.g., a particular number and/or a percentage of the maximum number) of programming pulses, the biasing scheme might change. For example, the maximum number might be 20 programming pulses and the biasing scheme might change following the application of pulse number 15. Further, according to one or more embodiments, if one or more memory cells have not completed programming when the maximum number of pulses (e.g., 20) have been applied, those memory cells might be marked as defective, for example.

Figure 6:
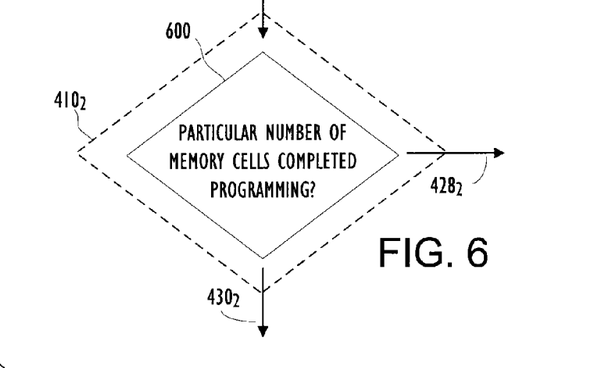
FIG. 6 shows additional detail of a programming process step such as shown in FIG. 4 according an embodiment of the present disclosure.

The biasing scheme may also be changed responsive to a threshold event 600, as illustrated in FIG. 6. For example, the biasing scheme may be changed when a particular number of selected memory cells have reached their intended states. For example, the particular number might be an actual count of the memory cells completing programming according to one or more embodiments. Further embodiments might change biasing states responsive to a percentage of memory cells of a selected page of memory cells reaching their intended states. For example, the biasing scheme might be changed $430_2$ when 80 percent of the memory cells of a selected page of memory cells to be programmed have reached their intended states. This percentage might differ from the number of cells undergoing programming however. For example, seventy five percent of the memory cells of the selected page might have the erased state, such as state 202 of FIG. 2, as their intended state for example. Thus, only five percent of memory cells of the selected page of memory cells might actually be programmed before achieving the 80 percent threshold example. In other words, the percentage criteria might depend not on the number of memory cells actually undergoing a programming (e.g., threshold voltage change) but instead on the percentage of program inhibited bit lines regardless of if the inhibited bit lines were originally inhibited or changed from an enabled state to an inhibited state over the course of the programming operation according to one or more embodiments of the present disclosure.

Figure 7:
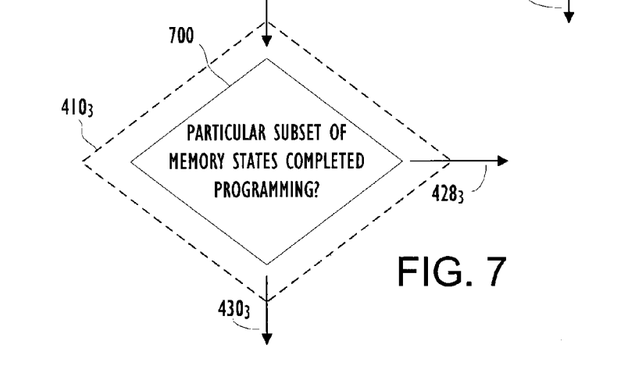
FIG. 7 shows additional detail of a programming process step such as shown in FIG. 4 according an embodiment of the present disclosure.

The biasing scheme may also be changed responsive to a threshold event 700, as illustrated in FIG. 7. The event 700 of FIG. 7 is when a particular number (e.g., a percentage and/or all) of memory cells to be programmed reach either their intended state or another particular state. For example, the selected page of memory cells might be configured to be programmed to one of the programmed states as illustrated in FIG. 2. The threshold event might be when all the memory cells to be programmed have either achieved their intended programmed states or other state. For example, the biasing scheme might be changed when memory cells to be programmed to the '01' state have all reached the '01' state, for example. Other threshold events and/or programmed states are possible according to one or more embodiments of the present disclosure.

Referring back to FIG. 4, following the decision to change biasing schemes 430, the unselected bit lines are biased to a second program inhibit level 414 (e.g., $V_{INH\_HIGH}$.) Selected bit lines are again biased to a program enable level (e.g., 0V.) An additional programming pulse is then applied to the selected word line followed by a verify operation to determine 418 if programming of the selected page is complete. If the memory cells of the selected page have completed programming then the programming operation is complete 420. If additional programming is necessary, the PGM PULSE CT is incremented 422. The current value of the PGM PULSE CT is compared 424 to a particular count value (e.g., a maximum count value.) If a particular count value (e.g., number applied programming pulses) has reached a set maximum value, the programming operation might be discontinued 420 and/or a determination (not shown) might be made to determine which memory cells have failed to program in the allotted number of applied programming pulses. Memory cells which are determined to be defective and/or the entire page of memory cells comprising the defective memory cells might be blocked from future use by the memory device. If the maximum number of programming pulses has not yet been applied, then the program pulse level is again increased by some amount 426 or might be held constant if a particular maximum $V_{PGM}$ level has been reached. Then, unselected bit lines are again biased to the second inhibit level and the selected bit lines are biased to the enable voltage 414. The increased programming pulse level is again applied to the selected page of memory cells 416 and another verify operation is performed. This sequence of steps is repeated until programming is complete 418 or a maximum number of programming pulses have been applied 424.

Figure 8:
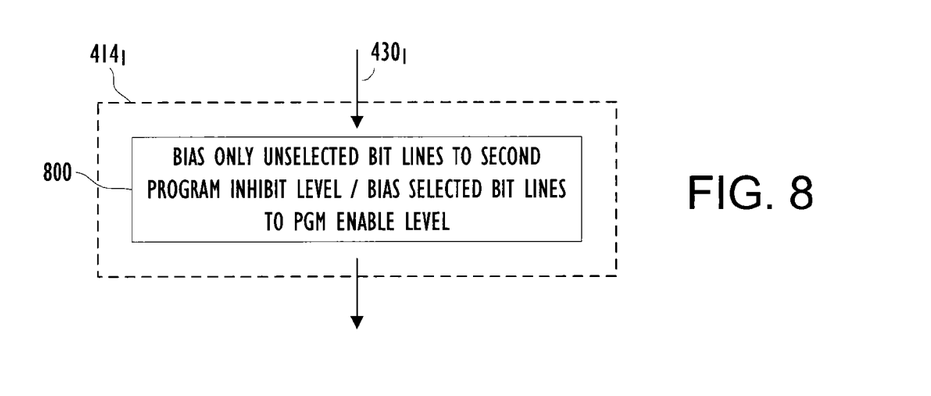
FIG. 8 shows additional detail of a programming process step such as shown in FIG. 4 according an embodiment of the present disclosure.
Figure 9:
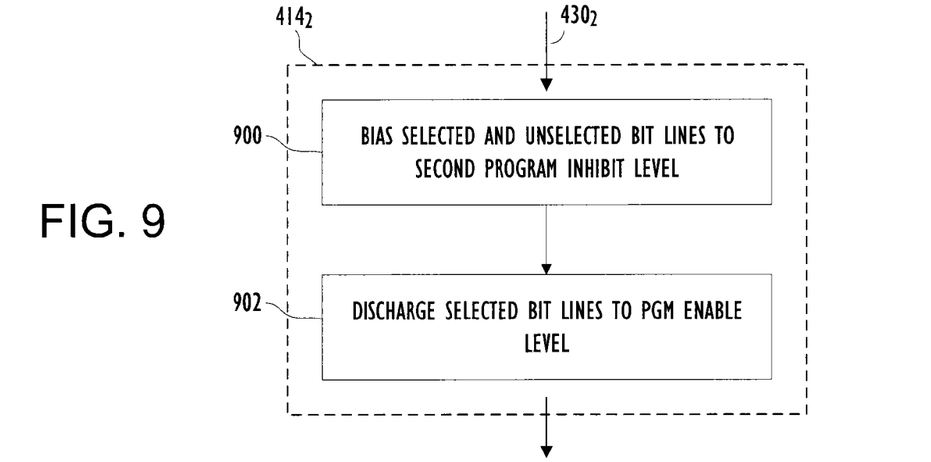
FIG. 9 shows additional detail of a programming process step such as shown in FIG. 4 according an embodiment of the present disclosure.

Step 414 of FIG. 4 illustrates a biasing scheme such as that discussed with respect to FIG. 3B. FIGS. 8 and 9 provide further detail of step 414 biasing scheme according to various embodiments of the present disclosure.

FIG. 8 illustrates additional detail of step 414$_1$ and shows a biasing scheme 800 wherein only the unselected bit lines are biased to the second program inhibit level (e.g., $V_{INH\_HIGH}$). The selected bit lines are biased to the program enable bias level (e.g., 0V). This is followed by applying a programming pulse to the selected word line, such as 416, for example. The selected and unselected bit lines might be biased to their respective levels in any order or might be biased substantially simultaneously according to one or more embodiments of the present disclosure.

FIG. 9 illustrates an alternate bit line biasing scheme 414$_2$ according to one or more embodiments of the present disclosure. FIG. 9 illustrates that step 414$_2$ comprises at least two steps 900 and 902. For example, both unselected and selected bit lines are biased to the second program inhibit level 900. This is followed by discharging only the selected bit lines 902 which is followed by applying a programming pulse and performing a verify operation, such as step 416, for example. A desirable result of this method 414$_2$ is as all the bit lines of the array are being biased up to the same high inhibit voltage, the amount of bit line to bit line capacitance (as discussed above) is thus reduced making it easier for the drive circuitry (e.g., 330) to bias the bit lines to the higher inhibit voltage than if adjacent selected bit lines are biased to the low program enable voltage, for example. Although not shown in FIG. 4, additional embodiments might also bias all bit lines to the first inhibit voltage followed by discharging the selected bit lines followed by applying a programming pulse, such as during steps 402 and 404, for example.

Although FIGS. 8 and 9 illustrate biasing the unselected bit lines to a second program inhibit voltage, additional levels might be utilized. For example, unselected bit lines might only be biased to either a first or second level, such as to either $V_{INH\_LOW}$ or $V_{INH\_HIGH}$. Additional embodiments might increase the bitline voltage during each performance of step 414 by a particular amount. For example, each pass of step 414 might increase the program inhibit bit line bias voltage by 0.1V, for example. Other voltage steps can be used according to various embodiments of the present disclosure.

It should be noted that the programming method illustrated by FIGS. 4-9 are not limited to those specifically described. For example, not every programming pulse is necessarily followed by a verify operation.

Figure 10:
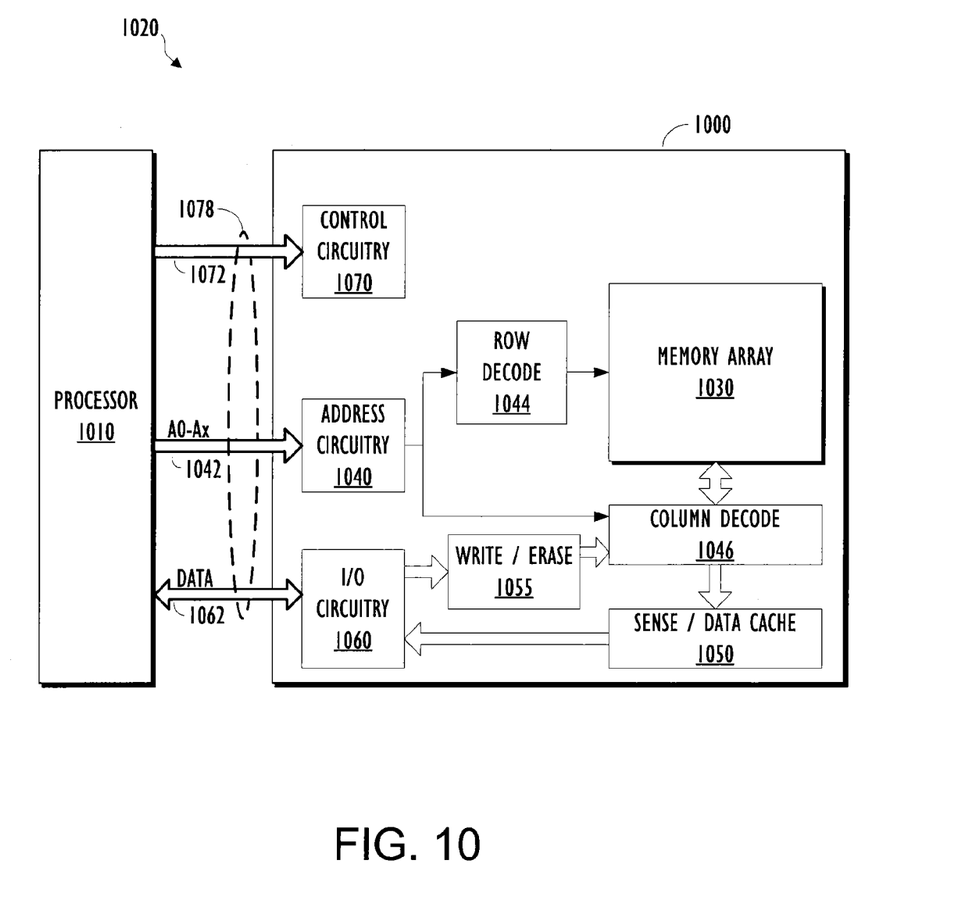
FIG. 10 shows a functional block diagram of a system according to an embodiment of the present disclosure.

FIG. 10 is a functional block diagram of an electronic system having at least one memory device according to one or more embodiments of the present disclosure. The memory device 1000 illustrated in FIG. 10 is coupled to a host such as a processor 1010. The processor 1010 may be a microprocessor or some other type of controlling circuitry. The memory device 1000 and the processor 1010 form part of an electronic system 1020. The memory device 1000 has been simplified to focus on features of the memory device that are helpful in understanding various embodiments of the present disclosure.

The memory device 1000 includes one or more arrays of memory cells 1030 that can be arranged in banks of rows and columns. Memory array 1030 may comprise SLC and/or MLC memory, for example. According to one or more embodiments, these memory cells of memory array 1030 are flash memory cells. The memory array 1030 can consist of multiple banks, blocks and segments of memory cells residing on a single or multiple die as part of the memory device 1000. The memory cells of the memory array 1030 may also be adaptable to store varying densities (e.g., MLC (four level) and MLC (eight level)) of data in each cell.

An address buffer circuit 1040 is provided to latch address signals provided on address input connections A0-Ax 1042. Address signals are received and decoded by a row decoder 1044 and a column decoder 1046 to access the memory array 1030. It will be appreciated by those skilled in the art, with the benefit of the present description, that the number of address input connections 1042 depends on the density and architecture of the memory array 1030. That is, the number of addresses increases with both increased memory cell counts and increased bank and block counts.

The memory device 1000 reads data in the memory array 1030 by sensing voltage or current changes in the memory array columns using sense devices, such as sense/data cache circuitry 1050. The sense/data cache circuitry 1050, in at least one embodiment, is coupled to read and latch a row of data from the memory array 1030. Sense/data cache circuitry can be used as the sense devices 330 such as shown in FIG. 3, for example. Data input and output buffer circuitry 1060 is included for bi-directional data communication over a plurality of data connections 1062 with the processor 1010. Write circuitry 1055 is provided to write data to the memory array 1030.

Control circuitry 1070 is configured at least in part to implement the methods of various embodiments of the present disclosure, such as the various data line biasing schemes, for example. Control circuitry 1070 might also be configured to determine when to change bias schemes as discussed above according to one or more embodiments of the present disclosure. In at least one embodiment, the control circuitry 1070 may utilize a state machine. Control signals and commands can be sent by the processor 1010 to the memory device 1000 over the command bus 1072. The command bus 1072 may be a discrete signal or may be comprised of multiple signals, for example. These command signals 1072 are used to control the operations on the memory array 1030, including data read, data write (program), and erase operations. The command bus 1072, address bus 1042 and data bus 1062 may all be combined or may be combined in part to form a number of standard interfaces 1078. For example, the interface 1078 between the memory device 1000 and the processor 1010 may be a Universal Serial Bus (USB) interface. The interface 1078 may also be a standard interface used with many hard disk drives (HDD) as are known to those skilled in the art. For example, the interface may take the form of an SATA or PATA interface.

The electronic system illustrated in FIG. 10 has been simplified to facilitate a basic understanding of the features of the memory and is for purposes of illustration only. A more detailed understanding of internal circuitry and functions of non-volatile memories are known to those skilled in the art.

Figure 11:
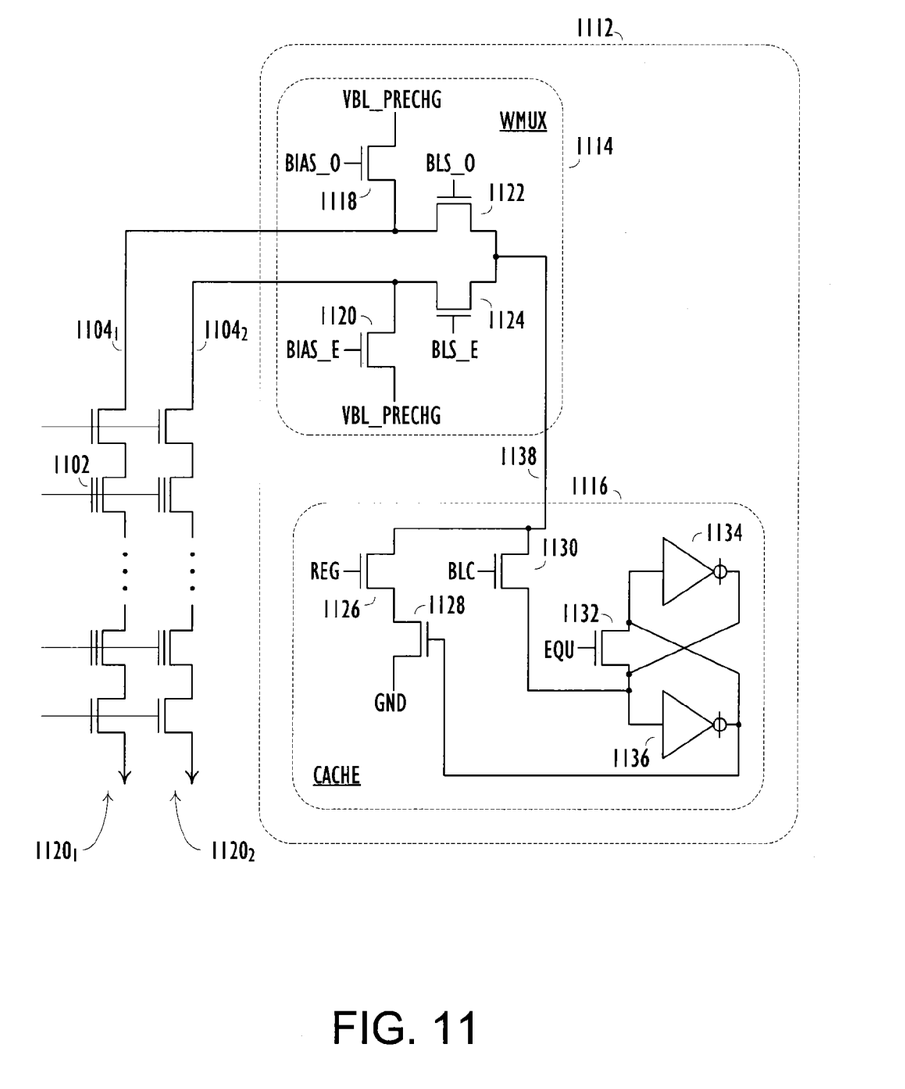
FIG. 11 shows a schematic diagram of a circuit according to an embodiment of the present disclosure.

FIG. 11 illustrates a simplified view of two NAND strings 1120 of memory cells 1102 coupled to control circuitry 1112 according to one or more embodiments of the present disclosure. The control circuitry 1112 shown in FIG. 11 can be a part of the control circuitry 1070 discussed above with respect to FIG. 10, for example. The two NAND strings of memory cells 1120 (illustrated with some detail omitted to improve readability) are similar in configuration to those discussed above with respect to FIGS. 3A and 3B. NAND string $1120_1$ may be considered an odd string while NAND string $1120_2$ may be considered an even string, for example. Accordingly, bit line $1104_1$ may be considered an odd bit line and $1104_2$ may be considered an even bit line.

The control circuitry 1112 of FIG. 11 comprises two subsets of circuitry. 1114 is a multiplexor (e.g., high voltage) circuit WMUX. 1116 is a cache circuit (e.g., low voltage) which could also comprise part of the cache circuit 1050 discussed above with respect to FIG. 10. Control circuitry 1112 is shown in a simplified form to improve readability of the figure and might further comprise additional circuitry than that shown. The circuitry shown in FIG. 11 is intended illustrate one of a number of implementations of the methods discussed above regarding various embodiments on the present disclosure. Signal names shown in FIG. 11 are intended to be illustrative but not limiting according to various embodiments of the present disclosure.

According to one or more embodiments, the WMUX 1114 circuit may precharge both bit lines to the VBL_PRECHG potential such as prior to performing a programming operation on one or more selected memory cells. The VBL_PRECHG level might be 4V, for example. According to one or more embodiments, the VBL_PRECHG potential might be twice Vcc. Other VBL_PRECHG voltages greater than Vcc may also be utilized. The VBL_PRECHG level might be in the range of voltages between Vcc and 4V, for example. Both bit lines 1104 may be charged individually and/or simultaneously to the VBL_PRECHG potential by activating transistors 1118 and 1120 utilizing signals BIAS_O and BIAS_E applied to the respective transistor control gates of transistors 1118 and 1120 as shown in FIG. 11. Concurrently, transistors 1122 and 1124 are deactivated utilizing signals BLS_O and BLS_E applied to the respective transistor control gates of transistors 1122 and 1124. For example, with transistor 1118 activated, the bit line $1104_1$ is biased up to the VBL_PRECHG level through transistor 1118. As transistors 1122 and 1124 are deactivated, circuit 1116 does not affect the bias of bit lines 1104. Following the biasing up of bit lines $1104_1$ and/or $1104_2$, transistors 1118 and 1120 are deactivated such as by changing the BIAS_O and BIAS_E signals applied to the transistor control gates.

The NAND strings 1120 coupled to the pre-charged bit lines 1104 might or might not include a memory cell selected for programming. As discussed above, even and odd NAND strings are typically programmed together, such as all the even numbered NAND strings might be programmed while the odd numbered NAND strings are inhibited from programming and vise-versa. If the group of NAND strings (e.g., even or odd NAND strings) selected for programming do not comprise memory cells selected for programming, such as in the case where one or more memory cells are not to be programmed and/or have already achieved an intended programmed state, multiple adjacent NAND strings might all be inhibited from programming during a particular programming operation. For example, neither NAND string 1120 might comprise a memory cell selected for programming. In another example, one of the NAND strings 1104 might comprise a memory cell selected for programming. To enable the NAND string comprising a selected memory cell, the pre-charge voltage present on the corresponding bit line (e.g., VBL_PRECHG) will be reduced. In one embodiment, the bit line voltage may be discharged to a 0V (e.g., ground) potential. In further embodiments the bit line might be discharged to a non-zero level (e.g., 0.5V) which is low enough to allow at least some programming effect to occur in the selected memory cell. Other voltages are possible according to various embodiments of the present disclosure.

The full and/or partial discharge of a bit line 1104 comprising a selected memory cell is discharged such as through transistors 1122 and 1124, for example. If NAND string $1120_2$ comprises a selected memory cell, transistor 1124 might be activated by the signal BLS_E shown in FIG. 11. This couples bit line $1104_2$ to the circuit 1116. As transistor 1122 is not enabled, the bit line $104_1$ is cut-off from circuit 1116, and thus retains the VBL_PRECHG potential. Circuit 1116 illustrates a plurality of control signals (e.g., REG, BLC, EQU) which are coupled to control gates of transistors 1126, 1130 and 1132 respectively. However, the one or more embodiments of the present disclosure are not limited to these signals but are illustrated to provide an example according to one implementation of the methods according to various embodiments of the present disclosure.

Transistor 1126 of circuit 1116 can be activated and/or deactivated by signal REG shown in FIG. 11 coupled to the control gate of the transistor. Circuit 1116 further comprises a second transistor 1128 coupled to transistor 1126 and to a ground 'GNU' potential. The control gate of transistor 1128 is coupled to the outputs of inverters 1134 and 1136. These inverters can be controlled by transistors 1130 and 1132 and these transistors can be activated and/or deactivated by signals BLC and EQU shown coupled to their control gates. Circuitry 1116 might comprise other circuits and/or circuit components (e.g., logic circuits) than those shown in the Figure.

As discussed above, to reduce the pre-charge voltage on a particular pre-charged bit line, transistors 1118 and 1120 are deactivated and transistors 1122 and/or 1124 are activated. Activating one or both of transistors 1122 and 1124 couples the respective pre-charged bit line 1104 to the node 1138 which couples circuit 1114 and 1116. To complete the intended voltage adjustment on a pre-charged bit line, one or more combinations of signals REG, BLC and EQU might be driven so as to activate transistors 1126 and 1128, for example. The activation of these two transistors completes a path to ground GND from a pre-charged bit line 1104 through activated transistors 1122 and/or 1124, through signal 1138 and through activated transistors 1126 and 1128 to GND. This path allows for part and/or all of the pre-charge potential present on a bit line 1104 to be discharged prior to a programming operation performed on a selected memory cell, for example.

Figure 12:
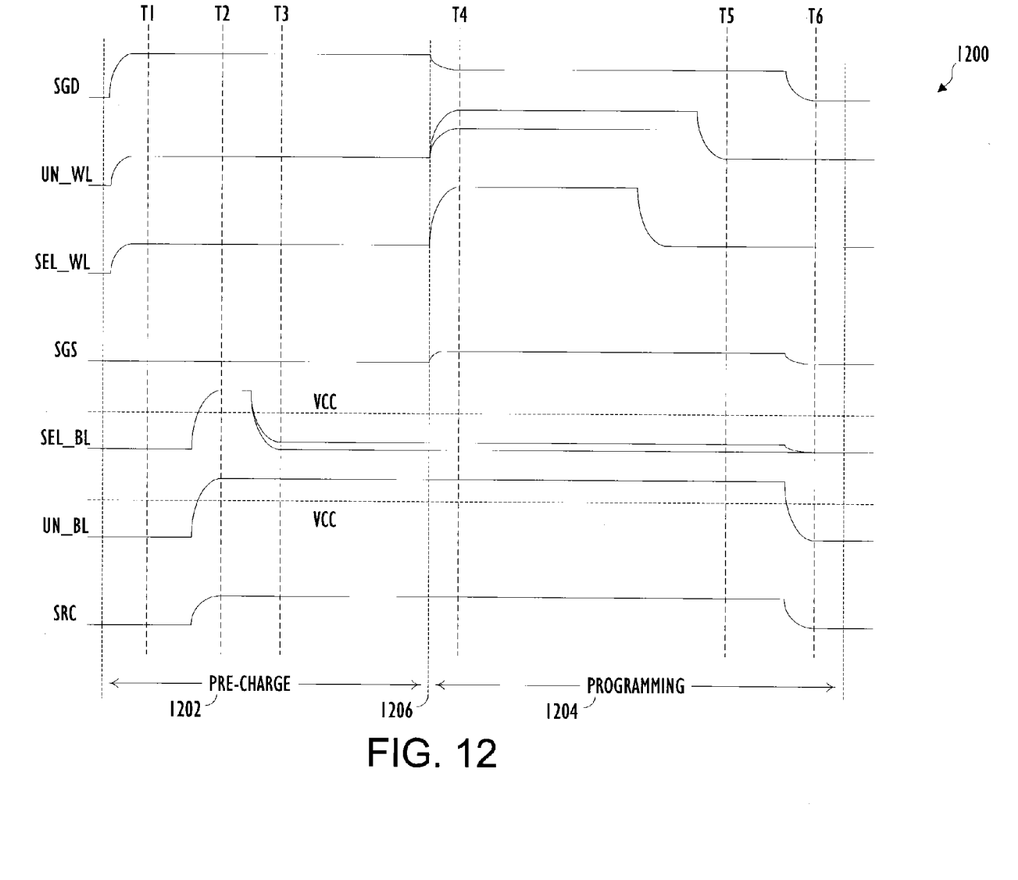
FIG. 12 shows a plot of waveforms according to an embodiment of the present disclosure.

FIG. 12 illustrates waveforms 1200 developed in implementing one or more biasing methods according to various embodiments of the present disclosure. Two phases of performing a programming operation are illustrated in FIG. 12. A pre-charge phase 1202 is performed followed by a programming phase 1204. The absolute magnitudes, relative magnitudes and/or durations (e.g., time) of the signals shown are not meant to be limiting but are intended to be illustrative in describing one or more embodiments according to the present disclosure.

The waveforms shown in FIG. 12 are discussed by way of example of a programming operation performed on a selected memory cell, such as memory cell $320_3$ of FIG. 3B, for example. Table 1 provides an example of biasing conditions applied during a programming operation shown in FIG. 12 and in accordance with one or more embodiments of the present disclosure. The SGD signal shown in FIG. 12 and Table 1 might correspond to the SGD signal 306, UN_WL (unselected word line) might correspond to signal lines $318_{0-3}$ and $318_{5-7}$, SEL_WL (selected word line) might correspond to signal $318_4$, SGS might correspond to signal 312, SEL_BL (selected bit line) might correspond to signal $324_3$, UN_BL (unselected bit line) might correspond to $324_{1\text{-}2}$ and $324_4$, and SRC might correspond to signal 314, for example. During the pre-charge phase 1202 at time T1, the SGD, UN_WL and SEL_WL signals are biased to the levels shown in Table 1. At T2, the SEL_BL and the UN_BL are biased up to a voltage greater than Vcc (e.g., $V_{INH\_HIGH}$), such as to 4V, for example. As shown at T3, the UN_BL bias level remains at 4V and the SEL_BL is discharged to a low and/or 0V voltage, for example. The SEL_BL might be biased to a potential of 0.5V, such as discussed above with respect to FIG. 11. It should be noted that following the transition 1206 from the pre-charge phase 1202 to the programming phase 1204 at T4, that the UN_WL bias is adjusted to a Vpass potential, such as to 10V, for example. The Vpass potential might be constant (e.g., 10V) across all unselected word lines and/or the Vpass potential might change dependent upon various conditions, such as proximity of an unselected word line to the selected word line, for example. The SEL_WL bias potential is increased by applying a programming potential to the SEL_WL. This applied programming potential (e.g., programming pulse) might increase from 12V up to 20V, for example. Additional signal biasing level changes to signals (e.g., SGD, SGS, SRC) are shown in Table 1. At T5, the programming potential on the SEL_WL and the Vpass potential on the UN_WLs has been discharged. Finally at T6 and the completion of the programming operation, one or all of the signal lines shown in FIG. 12 might be discharged to a potential of 0V, for example.

TABLE 1

| SIGNAL | PRE-CHARGE PHASE | | PROGRAMMING PHASE T = | | | |
|---|---|---|---|---|---|---|
| | T1 | T2 | T3 | T4 | T5 | T6 |
| SGD | 3 V | 3 V | 3 V | 2.5 V | 2.5 V | 0 V |
| UN_WL | 2 V | 2 V | 2 V | 0-10 V | 0 V | 0 V |
| SEL_WL | 2 V | 2 V | 2 V | 12-20 V | 0 V | 0 V |
| SGS | 0 V | 0 V | 0 V | 0.5 V | 0.5 V | 0 V |
| SEL_BL | 0 V | 4 V | 0 V/0.5 V | 0 V/.5 V | 0 V/0.5 V | 0 V |
| UN_BL | 0 V | 4 V | 4 V | 4 V | 4 V | 0 V |
| SRC | 0 V | 1.5 V | 1.5 | 1.5 V | 1.5 V | 0 V |

The pre-charge 1202 and programming 1204 phases and applied voltages as shown in FIG. 12 and Table 1 might be repeated one or more times, such as until all memory cells selected for programming have completed programming according to various embodiments of the present disclosure.

CONCLUSION

Various embodiments of the present disclosure provide methods for memory device biasing schemes during a programming operation. Low bit line program inhibit voltages are applied to inhibit bit lines while bit line to bit line capacitance is higher. As bit line capacitance decreases, higher bit line program inhibit voltages are used to mitigate the effects of program disturb.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art. Accordingly, this application is intended to cover any adaptations or variations of the disclosure.

What is claimed is:

1. A method of programming a memory device, the method comprising:
   biasing unselected data lines of a plurality of data lines to a first program inhibit voltage and biasing selected data lines of the plurality of data lines to a program enable voltage, wherein each data line of the plurality of data lines is connected to a respective string of series connected memory cells of a plurality of strings of series connected memory cells, wherein the selected data lines are coupled to memory cells selected for programming and the unselected data lines are not coupled to memory cells selected for programming;
   applying a plurality of first programming pulses to the memory cells selected for programming while biasing the unselected data lines to the first program inhibit voltage;
   biasing the unselected data lines to a second program inhibit voltage that is greater than the first program inhibit voltage and biasing selected data lines of the plurality of data lines to the program enable voltage when the plurality of first programming pulses reaches a certain number; and
   applying a plurality of second programming pulses to memory cells selected for programming while biasing the unselected data lines to the second program inhibit voltage.

2. The method of claim 1, wherein the first inhibit voltage is a supply voltage.

3. The method of claim 1, wherein the second inhibit voltage is twice the first inhibit voltage.

4. The method of claim 1, further comprising determining a selected memory cell to be defective when the plurality of first programming pulses combined with the plurality of second programming pulses reaches another certain number and the selected memory cell fails to program.

5. The method of claim 1, wherein the plurality of first programming pulses are a plurality of first increasing programming pulses and the plurality of second programming pulses are a plurality of second increasing programming pulses.

6. The method of claim 5, wherein an initial second programming pulse of the plurality of second increasing programming pulses has a voltage level greater than a final first programming pulse of the plurality of first increasing programming pulses.

7. A method of programming a memory device having a plurality of memory cells, the method comprising:
   for a first portion of a programming operation:
      biasing a first portion of data lines of a plurality of data lines to a program enable voltage, wherein each data line of the plurality of data lines is coupled to one or more memory cells of the plurality of memory cells, and wherein the first portion of data lines of the plurality of data lines are coupled to memory cells selected for programming for a first portion of a programming operation;
      biasing a second portion of data lines of the plurality of data lines to a first program inhibit voltage, wherein the second portion of data lines of the plurality of data lines are remaining data lines not coupled to the memory cells selected for programming for the first portion of the programming operation; and
      applying a plurality of first programming pulses to the memory cells selected for programming for the first portion of the programming operation while biasing the second portion of data lines of the plurality of data lines to the first program inhibit voltage; then for a second portion of the programming operation:
biasing each data line of the plurality of data lines to a second program inhibit voltage that is higher than the first program inhibit voltage;
discharging a third portion of data lines of the plurality of data lines, wherein the third portion of data lines of the plurality of data lines are coupled to memory cells selected for programming for the second portion of the programming operation; and
applying a plurality of second programming pulses to the memory cells selected for programming for the second portion of the programming operation while biasing a fourth portion of data lines of the plurality of data lines to the second program inhibit voltage, wherein the fourth portion of data lines of the plurality of data lines comprise data lines not coupled to the memory cells selected for programming for the second portion of the programming operation.

8. The method of claim 7, wherein biasing a second portion of data lines of the plurality of data lines to a first program inhibit voltage comprises biasing the second portion of data lines of the plurality of data lines to a supply voltage.

9. The method of claim 8, wherein biasing each data line of the plurality of data lines to a second program inhibit voltage comprises biasing each data line of the plurality of data lines to a voltage that is approximately twice the supply voltage.

10. The method of claim 7, further comprising performing the second portion of the programming operation after a particular number of the memory cells selected for programming for the first portion of the programming operation have completed their programming.

11. The method of claim 10, wherein the particular number of memory cells is a percentage of a total number of memory cells selected for programming for the first portion of the programming operation.

12. The method of claim 7, further comprising performing the second portion of the programming operation after a particular number of the memory cells selected for programming for the first portion of the programming operation have reached a particular programmed state.

13. The method of claim 7, further comprising performing the second portion of the programming operation after a particular number of the first programming pulses have been applied.

14. The method of claim 7, further comprising:
for a third portion of the programming operation:
biasing one or more data lines of the plurality of data lines coupled to memory cells to be inhibited from programming for the third portion of the programming operation to a third program inhibit voltage; and
applying a plurality of third programming pulses to memory cells selected for programming for the third portion of the programming operation;
wherein the third program inhibit voltage is greater than the second program inhibit voltage.

15. The method of claim 7, further comprising:
increasing the first program inhibit voltage with each successive application of one of the first programming pulses to a memory cell selected for programming for the first portion of the programming operation.

16. The method of claim 7, further comprising:
increasing the second program inhibit voltage with each successive application of one of the second programming pulses to a memory cell selected for programming for the second portion of the programming operation.

17. The method of claim 7, wherein biasing a first portion of data lines of a plurality of data lines to a program enable voltage and biasing a second portion of data lines of the plurality of data lines to a first program inhibit voltage comprises biasing each data line of the plurality of data lines to the first program inhibit voltage and discharging the first portion of data lines of the plurality of data lines to the program enable voltage.

18. A method of programming a memory device having a plurality of memory cells, the method comprising:
for a first portion of a programming operation:
biasing each data line of a plurality of data lines to a first program inhibit voltage, wherein each data line of the plurality of data lines is coupled to one or more memory cells of the plurality of memory cells;
discharging a first portion of data lines of the plurality of data lines, wherein the first portion of data lines of the plurality of data lines are coupled to memory cells selected for programming for the first portion of the programming operation; and
applying a plurality of first programming pulses to the memory cells selected for programming for the first portion of the programming operation while biasing a second portion of data lines of the plurality of data lines to the first program inhibit voltage, wherein the second portion of data lines of the plurality of data lines are not coupled to memory cells selected for programming for the first portion of the programming operation; then
for a second portion of the programming operation:
biasing each data line of the plurality of data lines to a second program inhibit voltage that is higher than the first program inhibit voltage;
discharging a third portion of data lines of the plurality of data lines, wherein the third portion of data lines of the plurality of data lines are coupled to memory cells selected for programming for the second portion of the programming operation; and
applying a plurality of second programming pulses to the memory cells selected for programming for the second portion of the programming operation while biasing a fourth portion of data lines of the plurality of data lines to the second program inhibit voltage, wherein the fourth portion of data lines of the plurality of data lines are not coupled to memory cells selected for programming for the second portion of the programming operation.

19. The method of claim 18, wherein the first portion of data lines of the plurality of data lines and the second portion of data lines of the plurality of data lines are mutually exclusive, wherein the third portion of data lines of the plurality of data lines and the fourth portion of data lines of the plurality of data lines are mutually exclusive, wherein a union of the first portion of data lines of the plurality of data lines and the second portion of data lines of the plurality of data lines is all data lines of the plurality of data lines, and wherein a union of the third portion of data lines of the plurality of data lines and the fourth portion of data lines of the plurality of data lines is all data lines of the plurality of data lines.

* * * * *